United States Patent [19]

Bouard

[11] Patent Number: 4,609,414
[45] Date of Patent: Sep. 2, 1986

[54] EMITTER FINGER STRUCTURE IN A SWITCHING TRANSISTOR

[75] Inventor: Philippe Bouard, Paris, France

[73] Assignee: Thomson-CSF, Paris, France

[21] Appl. No.: 501,189

[22] Filed: Jun. 6, 1983

[30] Foreign Application Priority Data

Jun. 8, 1982 [FR] France .................. 82 09954

[51] Int. Cl.$^4$ .................. H01L 29/72; H01L 21/24
[52] U.S. Cl. .................. 148/179; 29/571; 148/177; 148/178; 148/188
[58] Field of Search .................. 29/571; 148/177, 178, 148/179, 188; 357/34, 36, 38, 64

[56] References Cited

U.S. PATENT DOCUMENTS

| | | | |
|---|---|---|---|
| 3,258,371 | 6/1966 | Sukegawa et al. | 148/178 |
| 3,728,592 | 4/1973 | Toshi et al. | 148/189 |
| 3,943,549 | 3/1976 | Jaecklin et al. | 357/64 |
| 3,947,864 | 3/1976 | Yatsuo et al. | 357/64 |
| 4,177,477 | 12/1979 | Hokuyo et al. | 357/64 |
| 4,315,271 | 2/1982 | Roger | 357/36 |
| 4,345,266 | 8/1982 | Owyang | 357/36 |

FOREIGN PATENT DOCUMENTS 2374743  1/1984  France .................. 357/34

Primary Examiner—Brian E. Hearn
Assistant Examiner—Hunter L. Auyang
Attorney, Agent, or Firm—Oblon, Fisher, Spivak, McClelland & Maier

[57] ABSTRACT

A particular emitter finger structure in an NPN type switching transistor. The emitter zone is divided into two lateral N type strips. In the central part are provided, on the one hand, a diffusion of N type dopants whose junction depth is small and, on the other hand, a gold diffusion substantially of the same depth as that of the junction depth of said lateral zones. Thus, any possibility of injection at the center of the emitter finger is removed, which allows higher speed transistors to be obtained.

1 Claim, 9 Drawing Figures

EMITTER FINGER STRUCTURE IN A SWITCHING TRANSISTOR

BACKGROUND OF THE INVENTION

1. Field of the Invention

The present invention relates to the field of transistors and more particularly to average and high power transistors used in switching, that is to say capable of going very quickly over from the conducting state to the disabled state.

2. Description of the Prior Art

These transistors generally have interdigitated emitter and base structures, that is to say that the emitter and base zones comprise at least partially portions in the form of imbricated strips.

FIG. 1 shows a partial perspective view in cross section of a digitated emitter transistor, this view being schematical. This transistor comprises N+ and N type collector layers 1 and 2 and a P type base layer 3, in which are formed generally by diffusion N+ type emitter zones 4 having the form of elongate fingers. Between the emitter fingers 4 there may possibly be provided base fingers 5 formed of P type zones with a doping level higher than the doping level of layer 3 so as to promote the ohmicity of the contacts. Above the emitter diffusions 4 are provided emitter metalizations 6 and, between these emitter metalizations, are provided base metalizations 7. The lower face is coated with a collector metalization 8. The upper face of the wafer, outside the contact zones with the metalizations, is protected by a silicon oxide layer 9 ($SiO_2$).

FIG. 2 shows a view in enlarged and schematic section of the structure of an emitter finger. There can be seen therein the base layer 3, the emitter zone 4, the emitter metalization 6 and the oxide layer 9. At the moment when it is desired to interrupt the passage of the current through the transistor, it is the lateral parts of the emitter zone which will be affected first by the currents from the adjacent base electrodes 7 and the current lines are concentrated in the central part of the emitter zone. This phenomenon of concentration of the current lines on opening which slows down switching over to the disabled state of a transistor has been studied by numerous authors under the term of focussing of the current lines.

Different remedies have been proposed for palliating this drawback.

A first remedy, illustrated in FIG. 3, consists quite simply in removing the central part of the emitter finger and in coating it with an oxide layer 10 before providing the metalization 6. Each emitter finger is then divided into two distinct fingers 11 and 12 connected together by the metalization 6, this metalization having substantially the same width and the same thickness as that shown in FIG. 2, the section of this metalization being determined with respect to the current which it is desired to pass through the emitter and so as to obtain a substantially equipotential area over the whole surface of the emitter zone. A drawback of the structure of FIG. 3 is that if the oxide layer 10 has a defect (a hole), the metalization 6 will short-circuit the base and emitter zones.

To avoid this drawback, the prior art has also proposed the structure illustrated in FIG. 4 in which each emitter finger is also divided into two strips 11 and 12, but where a diffusion 13 of doping atoms of the same type as those of zones 11 and 12 is provided in the central part and where the metalization 6 is laid over the whole emitter zone including the central part without insulation. Thus, possible base/emiter short-circuits are avoided which may result from structural defects in the oxide layer 10 of FIG. 3. Nevertheless, the structure of FIG. 4 has the obvious disadvantage of being less efficient than the structure of FIG. 3 because, in spite of everything, there occurs an injection at the level of the central part 13 of the emitter.

It will be further noted that, in the case of FIGS. 3 and 4, an injection occurs in the neighborhood of the central zone from the lateral parts 14 and 15 of the strip shaped emitter zones 11 and 12.

SUMMARY OF THE INVENTION

The present invention provides a new emitter finger structure avoiding the above mentioned disadvantages of known structures and allowing higher switching speed on opening to be obtained. The present invention relates more particularly to the case of NPN transistors and a process for manufacturing such transistors.

The invention provides then an emitter finger structure in an NPN type switching transistor in which each emitter finger disposed under an emitter metalization comprises three distinct zones in the form of longitudinal strips, namely two lateral phosphorous doped zones with a surface concentration of doping atoms greater than $10^{20}$ atoms/$cm^3$ and having a first junction depth; and a central arsenic doped zone with a second junction depth substantially smaller than the first junction depth, this zone also containing gold atoms over a depth of the order of the first junction depth.

BRIEF DESCRIPTION OF THE DRAWINGS

The objects, features and advantages as well as others of the present invention will be set out in the following description of particular embodiments made with reference to the accompanying figures in which.

It will be generally noted in the figures that no scale has been respected between the thicknesses and the widths of the different layers: on the contrary, in conformity with common practice in the field of representing semiconductors, the dimensions have been arbitrarily expanded in different directions so as to facilitate reading of the figures and improve their didactic aspect.

DESCRIPTION OF THE PREFERRED EMBODIMENTS

FIGS. 5A to 5E illlstrate particular steps in manufacturing an emitter finger in accordance with the invention.

Figure 1:
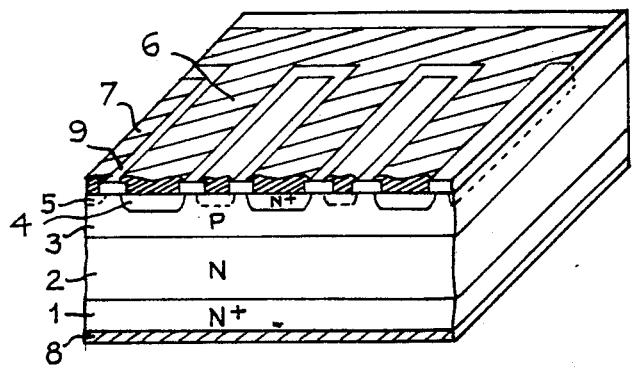
FIGS. 1 to 4 are for illustrating the state of the technique and have already been described.
Figure 2:
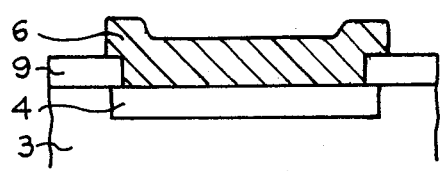
Figure 5A:
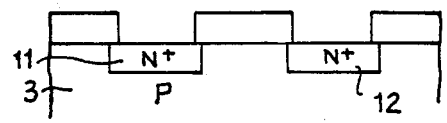
FIGS. 5A to 5E illustrate the steps for manufacturing the structure of the invention.

In a first step, illustrated in FIG. 5A, two strips 11 and 12 of an emitter finger are formed by phosphorous diffusion so as to obtain N+ emitter zones having a surface doping atom concentration higher than $10^{20}$ atoms/$cm^3$.

Figure 5B:
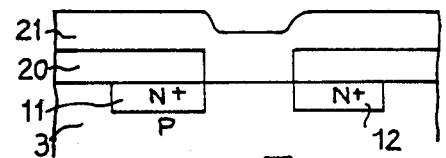
Figure 3:
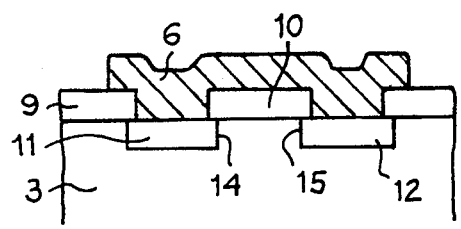

In a second step, illustrated in FIG. 5B, the structure is masked by means of a silica layer 20 and a gold layer 21 comprising arsenic is deposited, for example by cathode spraying.

Figure 5C:
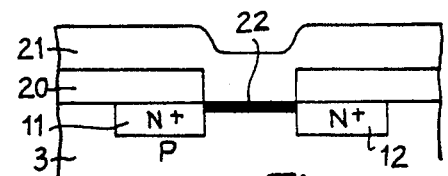
Figure 4:
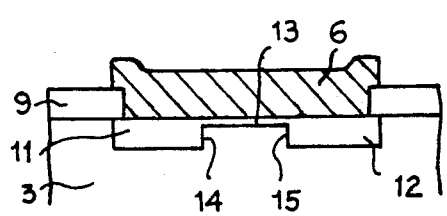
Figure 5D:
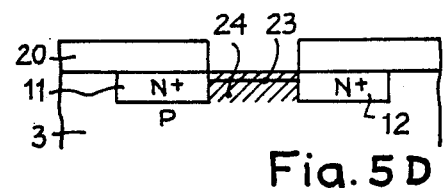

During the step shown in FIG. 5C, heating is provided so as to obtain an arsenic doped gold/silicon eutectic layer 22. Then the gold layer 21 is removed by etching with aqua regia. It will be noted that the largest part of the gold layer outside the zones situated between strips 11 and 12 could also have been removed before proceeding to the eutectic formation step so as to avoid the possibility of the gold passing through the silica layer 20. In this case, after formation of the eutectic, the remaining gold portions will be removed above the central strips situated between strips 11 and 12.

In the step illustrated in FIG. 5D, heating is again provided so as to cause the gold and the arsenic contained in the eutectic layer 22 to diffuse into the silicon then this eutectic is removed by selective chemical etching. As is known, gold diffuses quicker than arsenic. This diffusion step is stopped when the gold has penetrated into the silicon substrate to a depth substantially equal to the junction depth of the emitter zones 11 and 12. The junction depth 23 of the arsenic is then of the order of a fifth of that of zones 11 and 12. Gold doped zone 24 is hatched in the figure. By way of example, the surface concentration of arsenic may be some $10^{19}$ atoms/cm$^3$ and its junction depth of the order of 0.5 to 2 microns whereas the junction depth of layers 11 and 12 is of the order of 4 to 10 microns.

Figure 5E:
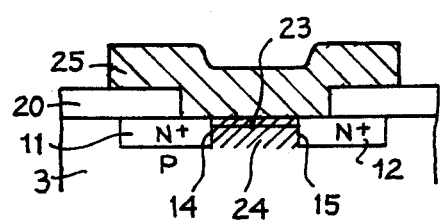

As shown in FIG. 5E, an additional opening in the masking layer 20 is provided and an emitter metalization 25 is deposited covering at least the surface part of the emitter strips 11 and 12 adjacent the central zone.

Thus, because of the existence of the arsenic zone, there cannot be any short-circuit between the emitter metalization (generally made from aluminium) and the P type base zone 3. Furthermore, because of the presence of gold atoms in the intermediate part between zones 11 and 12, the injection power of the central part of the emitter formed by junction 23 and by the internal lateral parts 14 and 15 of the emitter zones 11 and 12 is practically inhibited. Thus, all the difficulties related to the prior art structures described above are resolved (possibility of defects and existence of a not inconsiderable residual injection at the level of the central part of the emitter finger), which substantially eliminates the phenomenon of focussing of the current lines and reduces the switching time on opening.

The structure has been described above in the very particular case where zones 11 and 12 are highly doped with phosphorous and where arsenic is used as dopant in the central zone. These characteristics form an element of the present invention. In fact, successive dopants should be chosen which are compatible and selective with respect to gold: the gold must diffuse more quickly than the dopant contained in the central zone and the dopant of the lateral zones 11 and 12 must also form a barrier for gold, which is the case with phosphorous (gold cannot diffuse through a silicon zone in which the phosphorous concentration is greater than about $10^{20}$ atoms/cm$^3$). Thus, due to the choice of phosphorous, the width of the opening in the masking layer 20 (FIG. 5B) is not critical and even if this opening extends a little over the central surface portions of zones 11 and 12, there will not for all that be any gold diffusion in these zones which would adversely affect the quality of the injection at the useful parts of the emitter.

The present invention is not limited to the embodiments described above; it embraces on the contrary the different variations and generalizations included within the scope of the following claims.

I claim:

1. A method for manufacturing a NPN bipolar transistor with interdigitated emitter and base fingers, each emitter finger comprising a central portion and two lateral portions, said central portion and lateral portions being contacted by a common emitter metallisation, said method comprising the following steps:

formation of said lateral portions by local phosphorous diffusion with a surface concentration greater than $10^{20}$ atoms/cm$^3$, said phosphorus diffusion extending at a first depth;

formation of silicon oxide masking the emitter and base fingers except in said central portion;

depositon of an arsenic doped gold layer on said silicon oxide and said central portion;

formation of a gold/silicon eutectic in said central portion;

selective removal of said gold layer where an eutectic has not been formed;

simultaneous diffusion of gold and arsenic in said central portion, said gold diffusing down to a depth approximately equal to said first depth and said arsenic diffusing down to a second depth much smaller than said first depth;

removal of said silicon oxide above said lateral portions at least in regions adjacent to said central portion; and deposition of an emitter metallisation.

* * * * *